US006800886B2

(12) United States Patent
Awano

(10) Patent No.: US 6,800,886 B2
(45) Date of Patent: Oct. 5, 2004

(54) SEMICONDUCTOR DEVICE AND METHOD FOR FABRICATING THE SAME

(75) Inventor: Yuji Awano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/435,471

(22) Filed: May 12, 2003

(65) Prior Publication Data

US 2003/0209802 A1 Nov. 13, 2003

(30) Foreign Application Priority Data

May 13, 2002 (JP) ........................................ 2002-136708

(51) Int. Cl.[7] .................... H01L 29/80; H01L 31/112
(52) U.S. Cl. .................... 257/276; 257/376; 257/349; 257/775; 257/722; 257/750
(58) Field of Search ................. 257/750, 722, 257/775, 751, 439, 376, 276, 741; 438/642, 625, 637

(56) References Cited

U.S. PATENT DOCUMENTS 6,548,313 B1 * 4/2003 Ravi et al. ..................... 438/6
2002/0163079 A1 * 11/2002 Awano ........................ 257/750
2003/0096104 A1 * 5/2003 Tobita et al. ................ 428/332
2003/0170930 A1 * 9/2003 Choi et al. .................... 438/99

FOREIGN PATENT DOCUMENTS

| JP | 5-121417 | * 5/1993 | ........ 438/FOR 478 |
| JP | 5-267480 | * 10/1993 | ................ 438/784 |

OTHER PUBLICATIONS

J. Che et al.; "Thermal Conductivity of Carbon Nanotubes"; http://www.foresight.org/Conferences/MNT7/Papers/Che/index.html; 1999; pp. 1–8.

* cited by examiner

Primary Examiner—Jasmine Clark
(74) Attorney, Agent, or Firm—Westerman, Hattori, Daniels & Adrian, LLP

(57) ABSTRACT

The semiconductor device comprises insulation films 30a–30f formed on a semiconductor substrate 10, and a thermal conductor 42 buried in the insulation films. The thermal conductor is formed on a tube structure of carbon atoms. The thermal conductor is formed on a tube structure of carbon atoms, which is a material of very high thermal conductivity, can effectively radiate heat of a very high generated in semiconductor elements, etc., such as transistors 24a, 24b, etc. Accordingly, the semiconductor device can have good heat radiation characteristics.

24 Claims, 20 Drawing Sheets

SEMICONDUCTOR DEVICE AND METHOD FOR FABRICATING THE SAME

CROSS-REFERENCE TO RELATED APPLICATION

This application is based upon and claims priority of Japanese Patent Application No. 2002-136708, filed on May 13, 2002, the contents being incorporated herein by reference.

BACKGROUND OF THE INVENTION

The present invention relates to a semiconductor device and a method for fabricating the semiconductor device, more specifically a semiconductor device having good heat radiation characteristics and a method for fabricating the semiconductor device.

The integration degree of semiconductor integrated circuits, such as LSI, etc. has continuously increased in accordance with Moore's law, and the requirement of increases of the computation speed more increases the calories per a unit volume. Accordingly, thermal measurements for the semiconductor integrated circuits are an important problem.

Heating in a semiconductor integrated circuit is more serious when an SOI (Silicon on Insulator) substrate is used as the substrate. This is because the SOI substrate includes an insulation film between the substrate and a semiconductor layer, which makes it difficult to radiate from the side of the substrate the heat generated in the semiconductor elements formed on the semiconductor layer.

The thermal measurements are an important problem also in single transistors of high output powers used in base stations, etc. of portable telephones. This is because the heating deteriorates the performances and lowers the reliability.

In semiconductor integrated circuits and transistors of high output powers, the heat radiation has been conventionally performed by adding heat radiator plates or forced cooling mechanisms, as of fin-type air cooling, water cooling or others.

However, in semiconductor integrated circuits, the thermal radiation is hindered by a number of inter-layer insulation films of low thermal conductivity hinders laid on the semiconductor substrates. In high output power transistors using compound semiconductors, the heat radiation is hindered by the protection films of low thermal conductivity. Even with the heat radiator plates or forced cooling mechanisms added, it has been difficult to make the heat radiation efficiency sufficient.

A technique of providing large openings on the side of the backsides of the semiconductor substrates for the heat radiation through the openings is proposed. However, it is not always easy to provide large openings on the side of the backsides of the semiconductor substrates. This incurs fabrication step increase and resultantly is a factor for cost increase.

SUMMARY OF THE INVENTION

An object of the present invention is to provide semiconductor device which can realize good heat radiation characteristics without incurring large cost increase, and a method for fabricating the semiconductor device.

According to one aspect of the present invention, there is provided a semiconductor device comprising: an insulation film formed on a semiconductor substrate; and a thermal conductor buried in the insulation film, the thermal conductor being formed of a self-assembled tube structure of carbon atoms.

According to another aspect of the present invention, there is provided a semiconductor device comprising a thermal conductor buried in a semiconductor substrate, the thermal conductor being formed of a tube structure of carbon atoms.

According to further another aspect of the present invention, there is provided a method for fabricating a semiconductor device comprising the steps of: forming an insulation film on a semiconductor substrate; and forming an opening in the insulation film; and growing a thermal conductor of a tube structure of carbon atoms in the opening.

According to further another aspect of the present invention, there is provided a method for fabricating a semiconductor device comprising the steps of: forming an opening in a semiconductor substrate; and growing a thermal conductor of a tube structure of carbon atoms in the opening.

According to the present invention, heat is radiated by means of the thermal conductors of carbon nanotubes, whose is a material of very high thermal conductivity, whereby heat generated in the semiconductor elements, the transistors, etc., can be effectively radiated. Accordingly, the semiconductor device according to the present invention can have good heat radiation characteristics.

DETAILED DESCRIPTION OF THE INVENTION

A First Embodiment

Figure 1A:
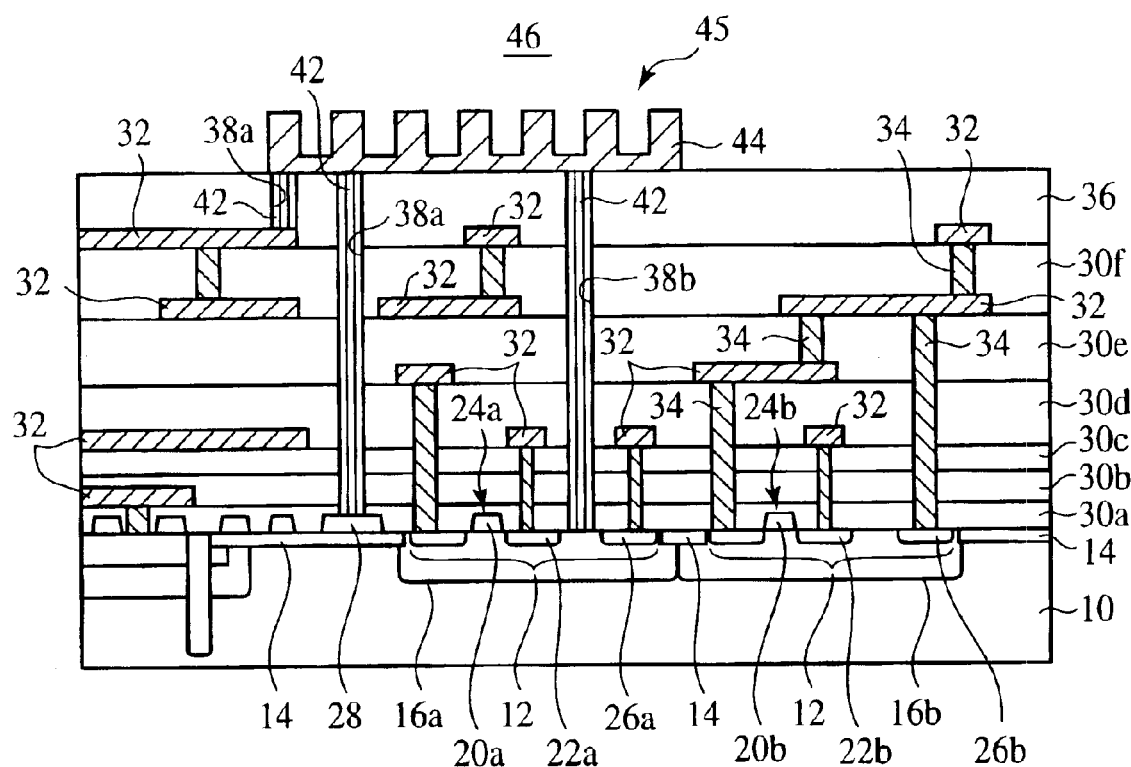
FIGS. 1A and 1B are views of the semiconductor device according to a first embodiment of the present invention.
Figure 1B:
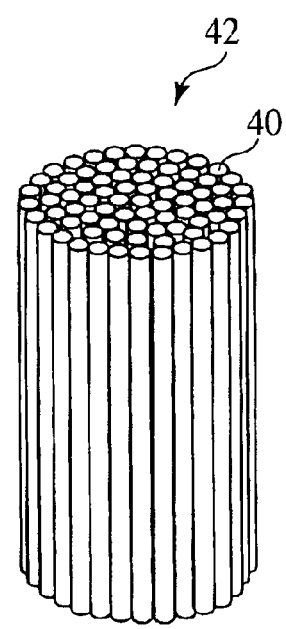

The semiconductor device according to a first embodiment of the present invention and the method for fabricating the semiconductor device will be explained with reference to FIGS. 1A to 7. FIGS. 1A and 1B are views of the semiconductor device according to the present embodiment. FIG. 1A is sectional view of the semiconductor device according to the present embodiment.

The Semiconductor Device

First, the semiconductor device according to the present embodiment will be explained with reference to FIGS. 1A and 1B.

As shown in FIG. 1A, element isolation regions 14 for defining element regions 12 are formed on the surface of a semiconductor substrate 10 of, e.g., silicon.

In the element regions 12 defined by the element isolation regions 14 an n-well 16a and a p-well 16b are formed.

In the n-well 16a, a p-channel transistor 24a having a gate electrode 20a and a source/drain diffused layer 22a is formed. A contact layer 26a heavily doped with a p type dopant is also formed in the n-well 16a.

In the p-well 16b, an n-channel transistor 24b having a gate electrode 20b and a source/drain diffused layer 22b is formed. A contact layer 26b heavily doped with an n type dopant is also formed in the p-well 16b.

An electrode 28 is formed on the element isolation region 14. The electrode 28 is connected to, e.g., a semiconductor element (not shown) of high calorie.

Inter-layer insulation films 30a–30f are sequentially laid one on another on the semiconductor substrate 10 with the transistors 24a, 24b formed on. Inter-layer insulation films 30a–30f are formed of a $SiO_2$ film and a barrier layer, respectively. The barrier layer is for preventing diffusion of Cu.

Interconnections 32 of, e.g., Cu are suitably formed on the respective inter-layer insulation films 30a–30f.

The respective interconnections 32 are suitably connected to the other interconnections 32, the source-drain diffused layers 22a, 22b, the contact layers 26a, 26b, etc. through vias 34 buried in the inter-layer insulation films 30a–30f.

A protection film 36 is formed on the inter-layer insulation film 30f. The protection film 36 is formed of a $SiO_2$ film and a barrier layer. The barrier layer is for preventing diffusion of Cu.

Openings 38a, 38b are formed in the protection film 36 and the inter-layer insulation films 30a–30f. The opening 38a is formed down to, e.g., the electrode 28 or the interconnection 32. The opening 38b is formed down to the surface of the semiconductor substrate 10 near the transistor 24a. The openings 38a, 38b have a 0.1 $\mu$m-diameter.

Cylindrical heat conductors 42 each of a bundle of carbon nanotubes are buried in the openings 38a, 38b.

A structure 36 or a part 36 may be added on the inter-layer insulation film 30f. In this case, the structure 36 or the part 36 is called a package or an interposer.

FIG. 1B is a perspective view of the heat conductors 42 buried in the openings 38a, 38b.

As shown in FIG. 1B, each heat conductor 42 is formed of a bundle of a plurality of carbon nanotubes 40. A diameter of each nanotube 40 is, e.g., about 1 nm. Each heat conductor 42 is formed of a bundle of hundreds to thousands of the carbon nanotubes 40.

Here, the carbon nanotube will be explained.

The carbon nanotube is a self-organized nano structure and a tube structure of carbon atoms. The carbon nanotube is cylindrical. The carbon nanotube is a new carbon-based material noted because of the unique properties. The carbon nanotube has a cylindrical structure of a graphite sheet, in which carbon atoms are combined with each other with the very strong bond, $sp2^+$. The diameter of the carbon nanotube is about 0.4 nm at minimum, and nanotubes of an about several hundreds microns-length are known. Very small size variations are characteristic of the nanotubes. The carbon nanotubes have the electric conduction widely varied from that of semiconductors to that of metals depending on the chilarity.

The thermal conductivity of the carbon nanotubes is as high as above 30 W/(cm·K).

Figure 2:
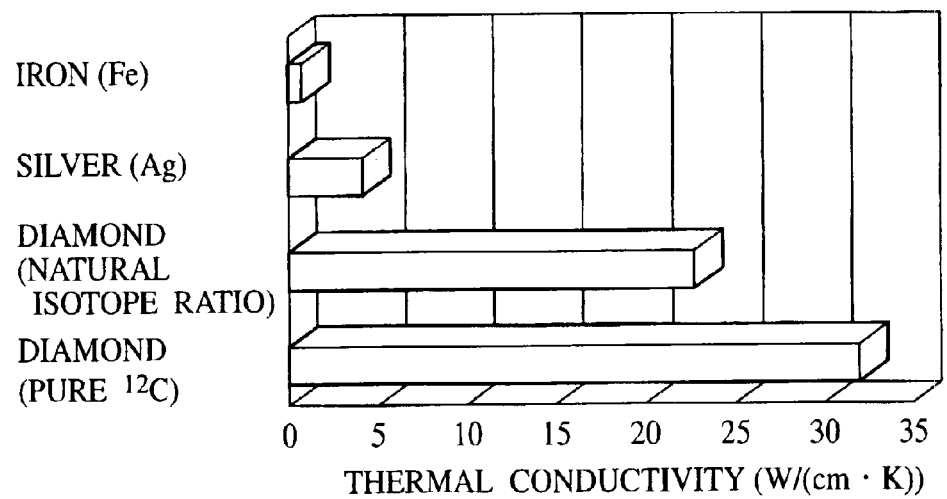
FIG. 2 is a graph of the thermal conductivities of iron, silver and diamond.

FIG. 2 shows a graph of the thermal conductivities of iron, silver and diamond.

As seen from FIG. 2, the thermal conductivity of $^{12}C$, which is pure diamond, is about 30 W/(cm·K). The carbon nanotubes have very high thermal conductivity which can be compared to that of $^{12}C$, the pure diamond.

Figure 3:
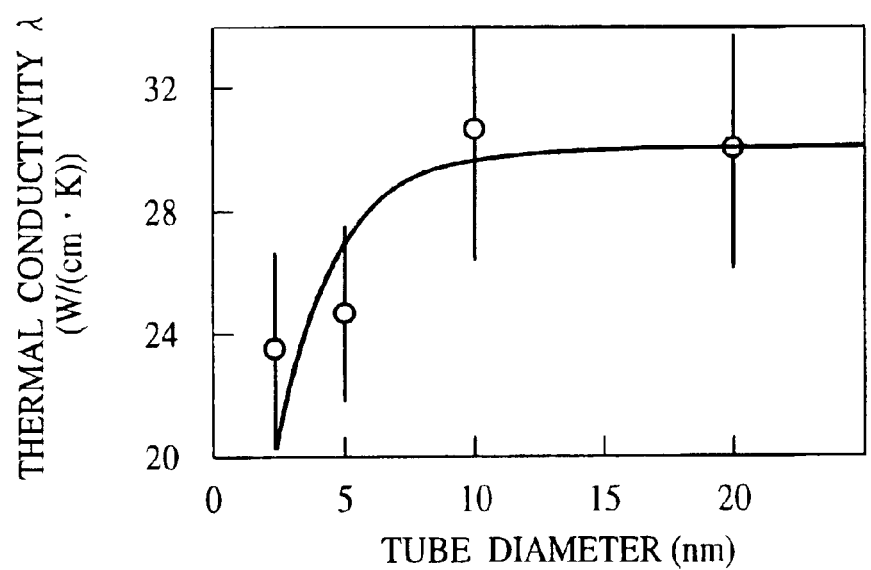
FIG. 3 is a graph of relationships between diameters of carbon nanotubes and thermal conductivities.

FIG. 3 is a graph of relationships between diameters of the carbon nanotubes and thermal conductivities. In FIG. 3, diameters of the carbon nanotubes are taken on the horizontal axis, and thermal conductivities of the carbon nanotubes are taken on the vertical axis.

FIG. 3 is cited from Thermal Conductivity of Carbon Nanotubes, Jianwei Che, Tahir Cagin and William A. Goddard III, http://www.foresight.org/Conferences/MNT7/Papers/Che/index. html.

The carbon nanotubes, which are a material of such very high thermal conductivity, are used as a material of the thermal conductors 42, whereby heat generated in the semiconductor elements, such as the transistors 24a, 24b, etc., is efficiently radiated.

The thermal conductor is connected to the electrode 28 on the left side of the drawing of FIG. 1A, and the thermal conductor 42 is connected to the surface of the semiconductor substrate 10 near the transistor 24a on the right side of the drawing of FIG. 1A. However, the positions the thermal conductors 42 are connected to are not limited to the above. The thermal conductors 42 may be connected to suitable positions so that required heat radiation can be realized.

A heat radiator plate 44 of, e.g., aluminum is formed on the protection plate 36 and the thermal conductors 42. The heat radiator plate 44 has concavities and convexities 45 for securing a larger surface area.

The heat radiation plate 44 may be added as a part on the protection film 36. In the case that the structure 36 or the part 36 is formed on the inter-layer insulation film 30f, the heat radiation plate 44 may be added on the structure 36 or the part 36.

The heat radiator plate 44 is to be contact with a heat bath 46 of air, water or others.

The semiconductor device according to the present embodiment is characterized mainly in that the thermal conductors 42 formed of the bundles of the carbon nanotubes 40 are buried in the inter-layer insulation films 30a–30f.

In the conventional semiconductor devices, heat generated in semiconductor elements, etc., such as transistors, etc. has not been able to be always effectively radiated.

Inconstant to this, in the present embodiment, the thermal conductors 42 formed of the bundle of the carbon nanotubes 40, which is a material of very high thermal conductivity, are buried in the inter-layer insulation films 30a–30f, whereby heat generated in the semiconductor elements, etc., such as the transistors 24a, 24b, etc. can be effectively radiated. Thus, according to the present embodiment, the semiconductor device according to the present embodiment can have good heat radiation characteristics.

The Method for Fabricating the Semiconductor Device

Next, the method for fabricating the semiconductor device according to the present embodiment will be explained with reference to FIGS. 4A to 7. FIGS. 4A to 7 are sectional views of the semiconductor device according to the present embodiment in the steps of the method for fabricating the semiconductor device, which explain the method.

Figure 4A:
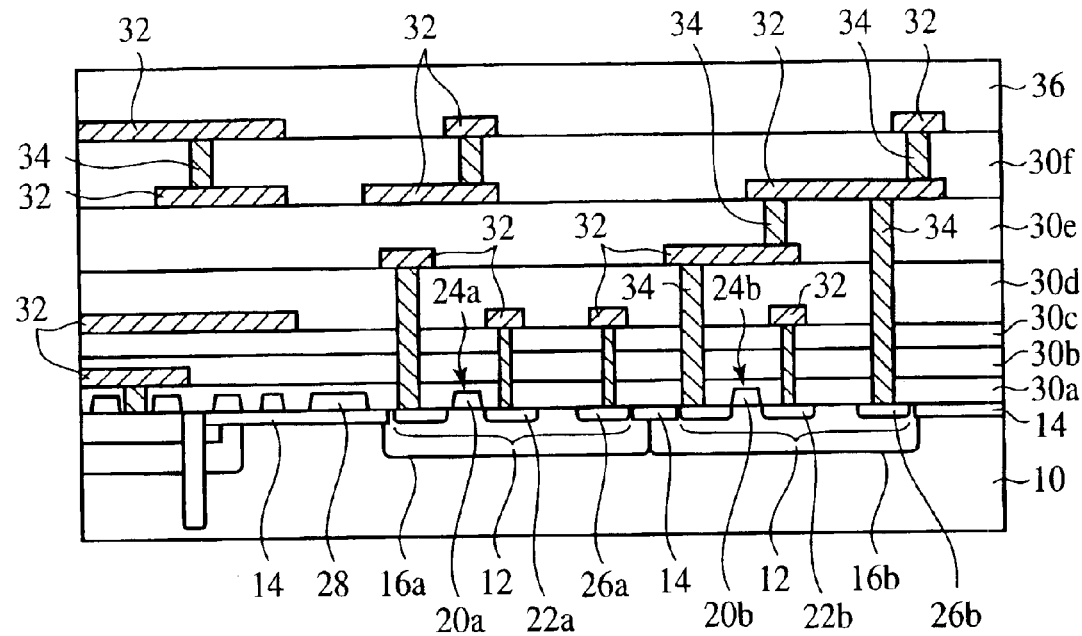
FIGS. 4A and 4B are sectional views of the semiconductor device according to the first embodiment of the present invention in the steps of the method for fabricating the semiconductor device, which show the method (Part 1).

As shown in FIG. 4A, the element isolation regions 14 for defining element regions 12 are formed on the surface of a semiconductor substrate 10 of, e.g., silicon.

Then, the n-well 16a and the p-well 16b are formed in the element regions 12 defined by the element isolation regions 14.

Then, the p-channel transistor 24a having the gate electrode 20a and the source/drain diffused layer 22a is formed in the p-well 16a. In the p-well 16a, the contact layer 26a heavily doped with a p type dopant is formed.

In the p-well 16b, the n-channel transistor 24b having the gate electrode 20 band the source/diffused layer 22b is formed. In the p-well 16b, the contact layer 26b heavily doped with an n type dopant is formed.

The electrode 28, etc. are suitably formed. Thus, the electrode 28 connected to, e.g., high calorific value semiconductor elements (not shown) is formed on the element isolation region 14.

Then, the inter-layer insulation films 30a–39f of, e.g., $SiO_2$, and the interconnections 32 of, e.g., Cu, etc. are formed on the semiconductor substrate 10 with the transistors 24a, 24b, etc. formed on. The interconnections 32 are suitably connected to the other interconnections 32, the source/drain diffused layers 22a, 22b, the contact layers 26a, 26b, etc. through the vias 34 buried in the inter-layer insulation films 30a–30f.

Then, the protection film 36 of $SiO_2$ is formed on the entire surface by, e.g., CVD.

Figure 4B:
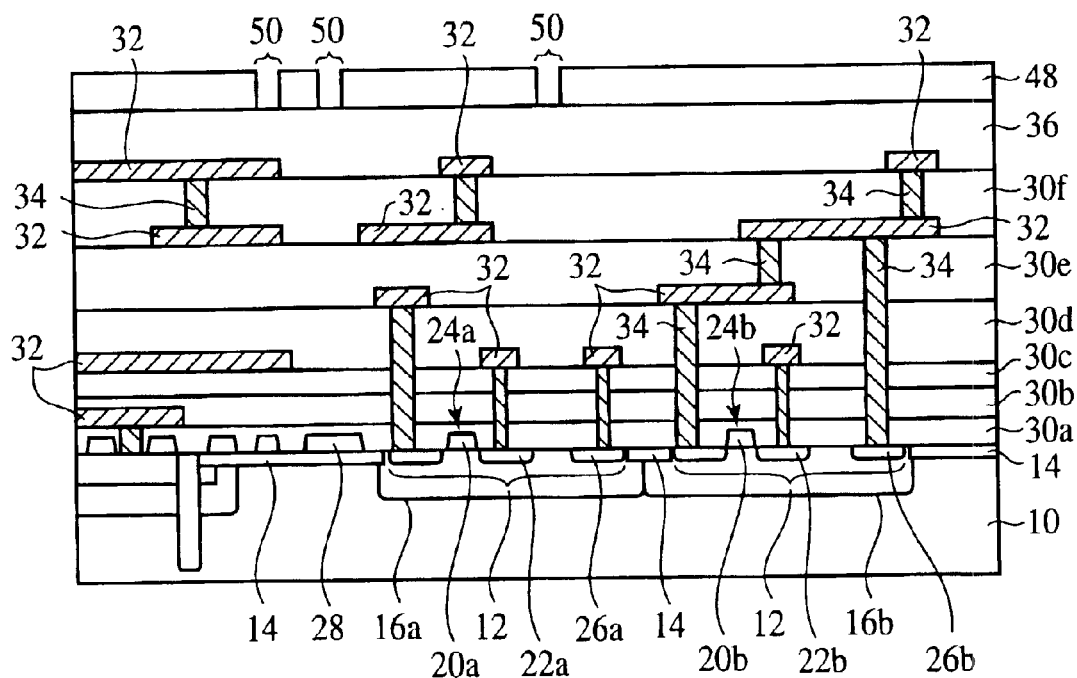

Then, as shown in FIG. 4B, a photoresist film 48 is formed on the entire surface by, e.g., spin coating. Then, the photoresist film 48 is patterned by photolithography. Thus, the openings 50 are formed in the photoresist film 48 down to the protection film. The openings 50 are for forming openings 38a, 38b for burying the thermal conductors 42 of the carbon nanotubes 40 in the protection film 36 and the inter-layer insulation films 30a–30f.

Figure 5A:
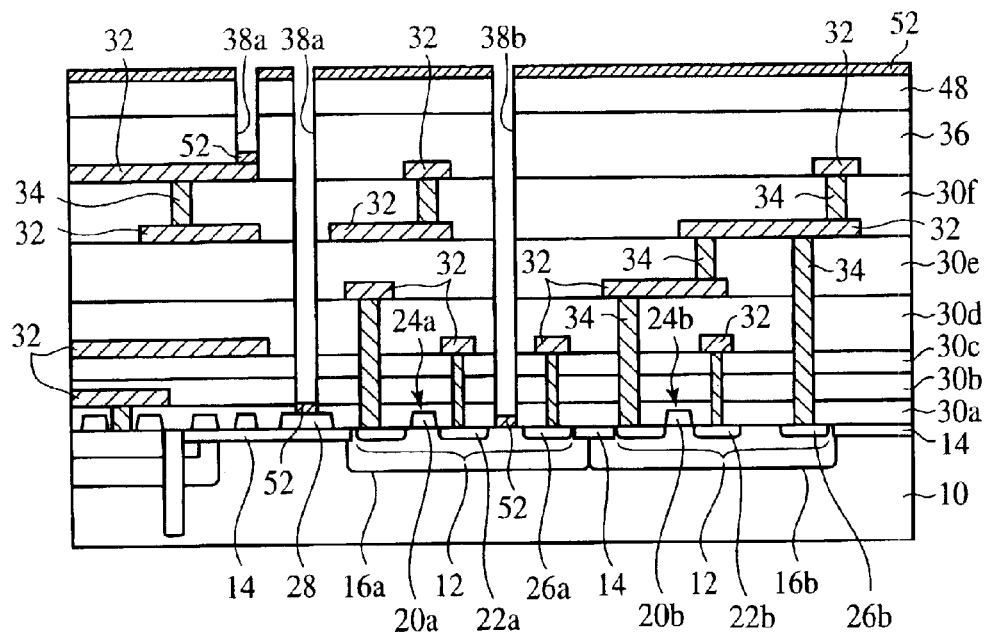
FIGS. 5A and 5B are sectional views of the semiconductor device according to the first embodiment of the present invention in the steps of the method for fabricating the semiconductor device, which show the method (Part 2).

Next, as shown in FIG. 5A, the protection film 36 and the inter-layer insulation films 30a–30f are etched by, e.g., plasma etching with the photoresist film 48 as a mask. Thus the opening 38a and the opening 38b are formed respectively down to, e.g., the electrode 28 and e.g., the surface of the semiconductor substrate 10 near the transistor 24a are formed. As an etching gas is, $SF_6$, for example, can be used.

Then, a catalyst layer 52 is formed on the entire surface by, e.g., evaporation. The catalyst layer 52 is for growing carbon nanotubes. As materials of the catalyst layer 52, transition metals, e.g., Ni, Fe, Co, or others, or alloys of their compounds can be suitably used. The thickness of the catalyst layer 52 may be equivalent to, e.g., several atomic layers.

Then, the photoresist film 48 is lifted off to remove an unnecessary part of the catalyst layer 52. Thus, the catalyst layer 52 is formed only on the bottoms of the openings 38a, 38b.

Figure 5B:
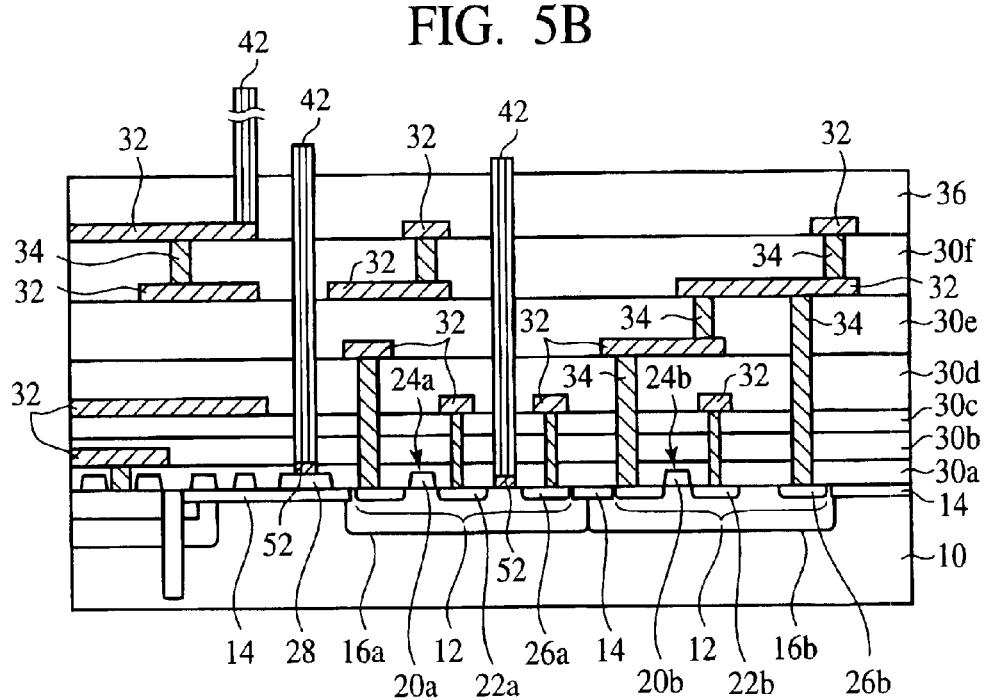

Next, as shown in FIG. 5B, the thermal conductors 42 of the carbon nanotubes 40 are grown on the catalyst layer 52 by, e.g., thermal CVD. The thermal conductors 42 are grown to be above, e.g., the upper surface of the protection film 36. As acetylene gas, for example, can be used. The growth temperature can be, e.g., 400–900° C. Thus, the thermal conductors 42 of the carbon nanotubes 40 can be formed in the openings 38a, 38b. The catalyst layer 52 is left on the roots of the carbon nanotubes 40, i.e., the bottom surfaces of the openings 38a, 38b.

In the present embodiment, the carbon nanotubes 40 are formed by thermal CVD, but can be formed by not only thermal CVD but also by other growing techniques. For example, the carbon nanotubes 40 can be formed by plasma CVD, and in this case, as a raw material gas, methane gas, for example can be used. The growth temperature may be, e.g., about 400–900° C. In the case that the carbon nanotubes 40 are formed by plasma CVD, the catalyst layer 52 is left on the forward ends of the carbon nanotubes 40, i.e., the upper ends of the thermal conductors 42.

Figure 6A:
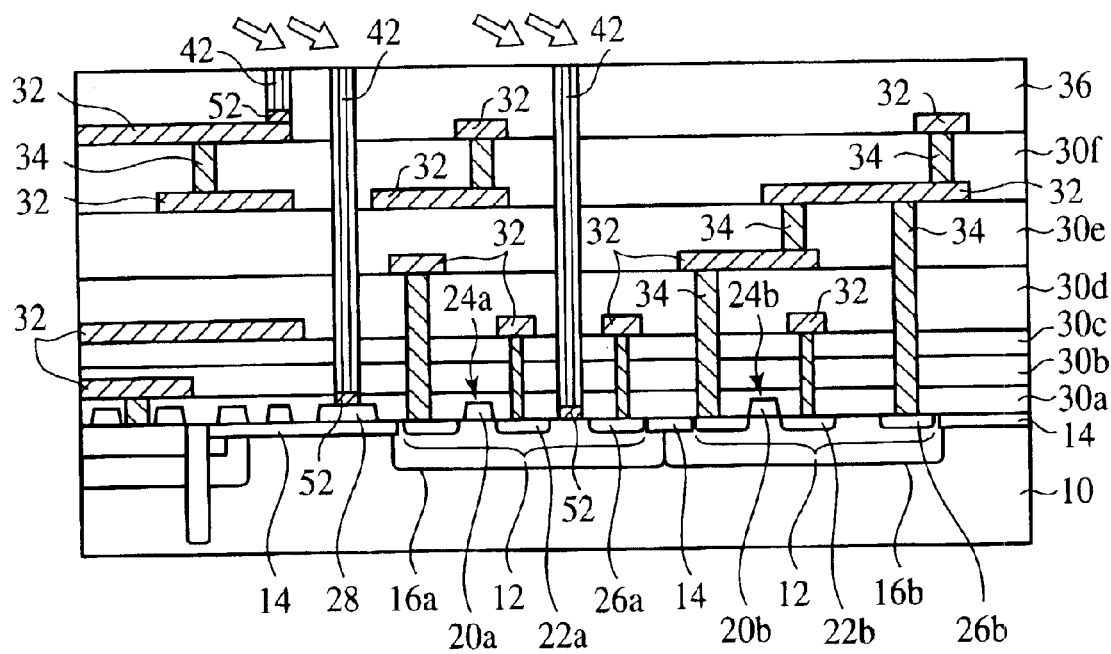
FIGS. 6A and 6B are sectional views of the semiconductor device according to the first embodiment of the present invention in the steps of the method for fabricating the semiconductor device, which show the method (Part 3).

Next, as shown in FIG. 6A, the parts of the thermal conductors 42 projected beyond the protection film 36 are partially etched off by argon ion milling. To partially etching off the thermal conductors 42 projected beyond the protection film 36, Ar ions are injected diagonally to the surface of the substrate.

Figure 6B:
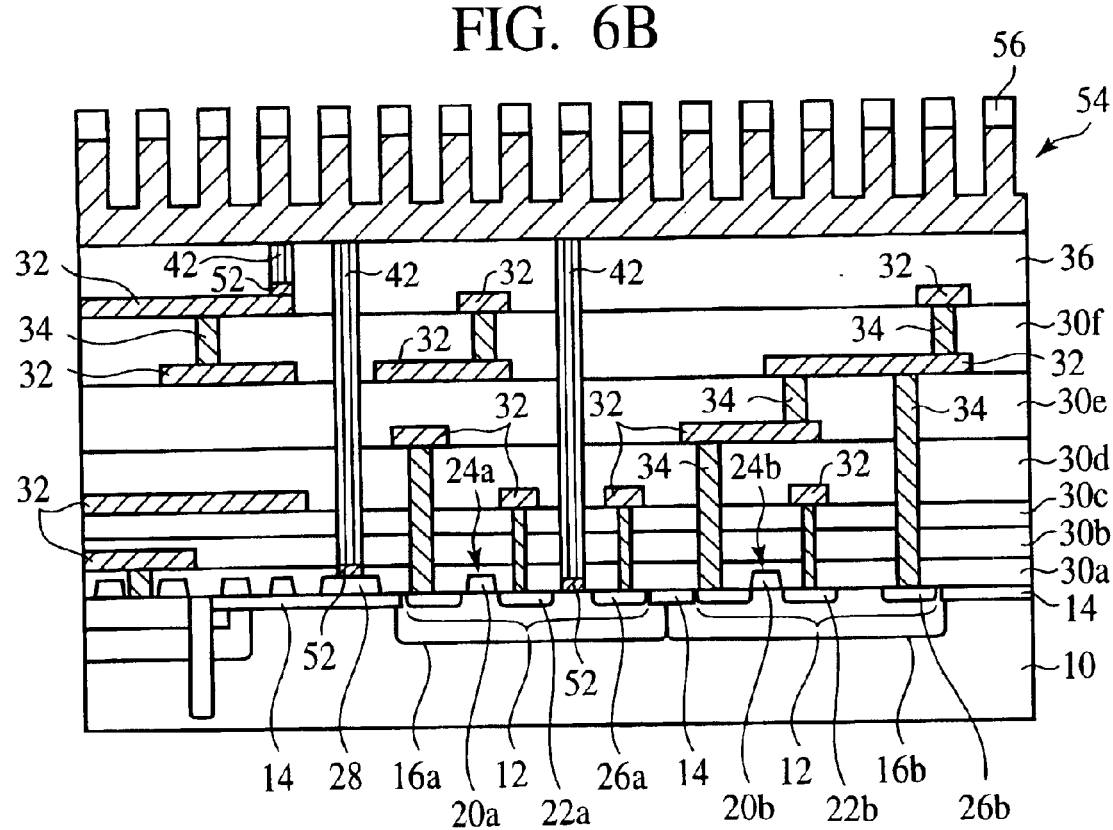

Next, as shown in FIG. 6B, an about 1 $\mu$m-thickness-metal layer 54 of aluminum is formed on the entire surface by, e.g., vacuum evaporation.

Next, a photoresist film 56 is formed on the entire surface by spin coating. Then, the photoresist film 56 is patterned in, e.g., stripes by photolithography.

Next, with the photoresist film 56 as a mask, the metal layer 54 is etching down to a set depth. Thus, the concavity and convexities 45 are formed in the surface of the metal layer 54 to thereby make the surface area of the metal layer 54 larger.

Figure 7:
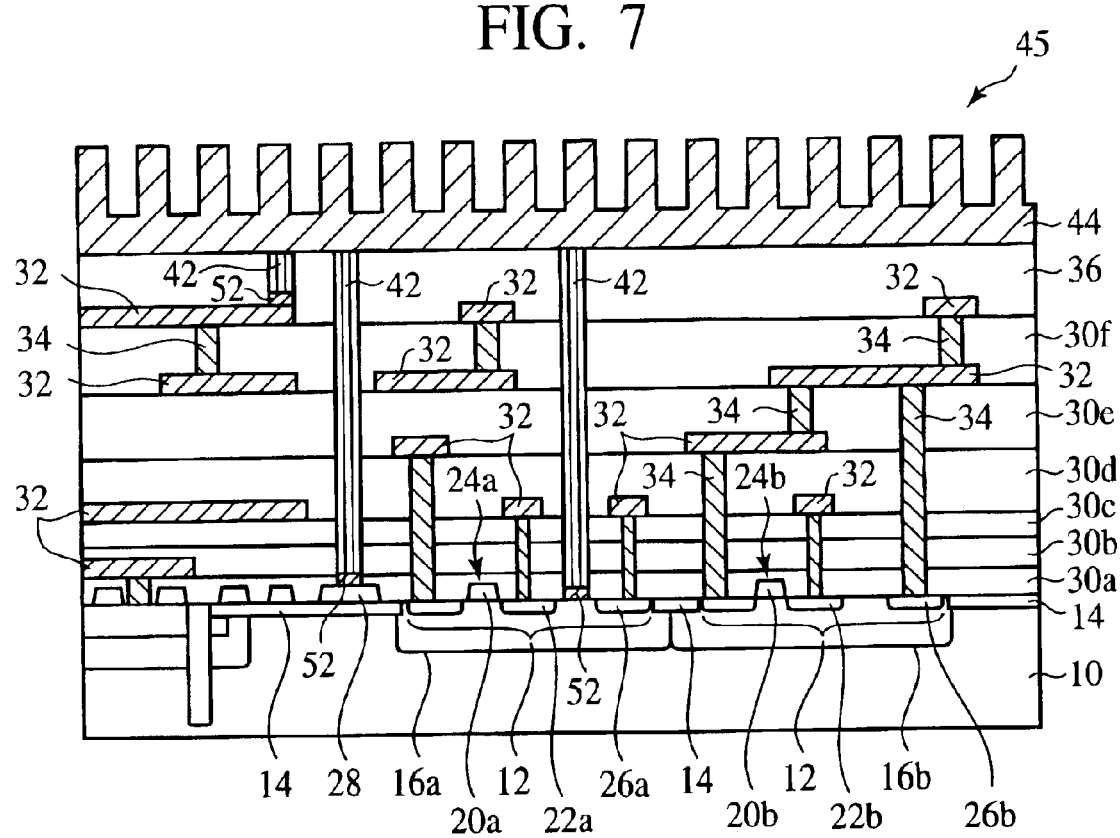
FIG. 7 is sectional views of the semiconductor device according to the first embodiment of the present invention in the steps of the method for fabricating the semiconductor device, which show the method (Part 4).

Thus, as shown in FIG. 7, the heat radiator plate 44 of the metal layer 54 is formed.

As described above, the semiconductor device according to the present embodiment is fabricated.

A Second Embodiment

Figure 8:
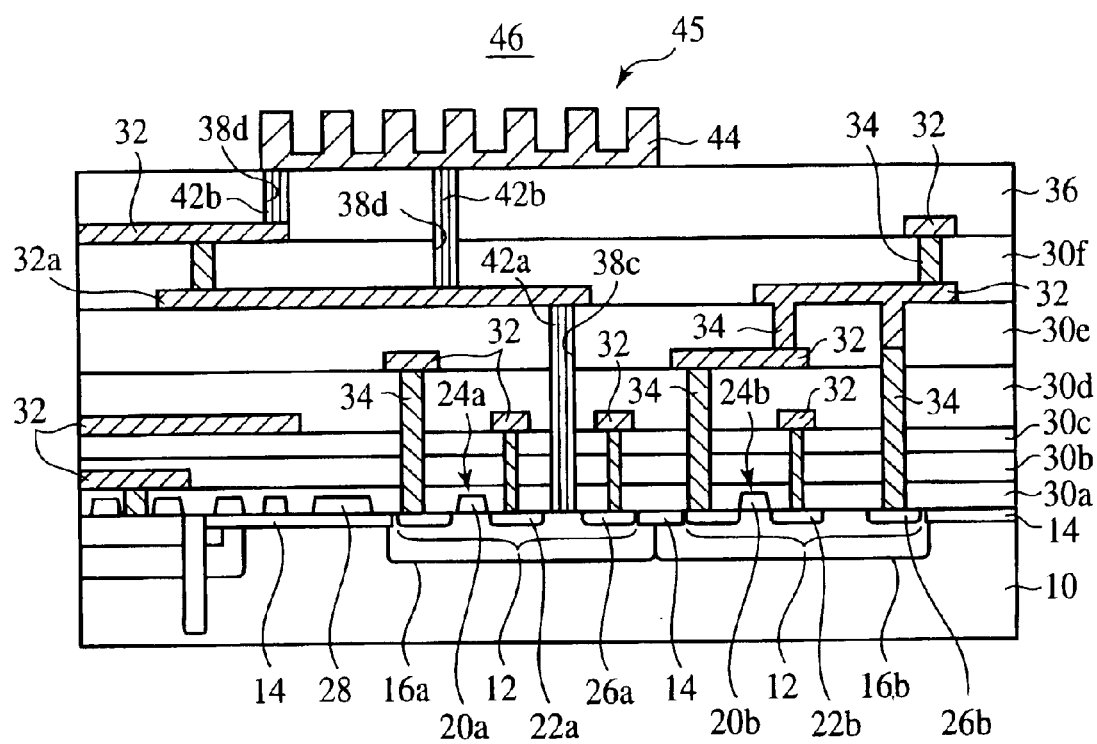
FIG. 8 is a sectional view of the semiconductor device according to a second embodiment of the present invention.

The semiconductor device according to a second embodiment of the present invention and the method for fabricating the semiconductor device will be explained with reference to FIG. 8 to FIG. 12. FIG. 8 is a sectional view of the semiconductor device according to the present embodiment. FIGS. 9A to 12 are sectional views of the semiconductor device according to the present embodiment in the steps of the method for fabricating the semiconductor device. The same members of the present embodiment as those of the semiconductor device according to the first embodiment and the method for fabricating the semiconductor device shown in FIGS. 1 to 7 are represented by the same reference numbers not to repeat or to simplify their explanation.

The semiconductor device according to the present embodiment is characterized mainly in that a plurality of thermal conductors 42a, 42b are serially connected through interconnections 32a extended horizontally to the substrate.

As shown in FIG. 8, an opening 38c is formed in an inter-layer insulation film 30a down to, e.g., the surface of a semiconductor substrate 10 near a transistor 24a. The thermal conductor 42a of a bundle of carbon nanotubes 40 is buried in the opening 38c.

An interconnection 32a of, e.g., Cu is formed on an inter-layer insulation film 30e. The interconnection 32a is connected to the thermal conductor 42a.

An opening 38d is formed in the inter-layer insulation films 30e, 30f and a protection film 36 down to the interconnection 32a. The thermal conductor 42b of a bundle of nanotubes 40 is buried in the opening 38. The thermal conductor 42b is serially connected to the thermal conductor 42a through the interconnection 32a. The interconnection 32a functions not only as a usual electric wire, but also as an intermediate thermal conductor for thermally interconnecting the thermal conductor 42a and the thermal conductor 42b.

Thus, the semiconductor device according to the present embodiment is formed.

The semiconductor device according to the present embodiment is characterized mainly in that as described above, a plurality of thermal conductors 42a, 42b are serially connected to each other through the interconnection 32a.

In the semiconductor device according to the first embodiment, one thermal conductor 42 is formed from the surface of the protection film 36 down to the surface of the semiconductor substrate 10, which has not made it always easy to ensure regions for the thermal conductors 42 to be buried in. It tends to be more difficult to ensure regions for the thermal conductors 42 to be buried in as a number of especially interconnections is larger.

In contrast to this, according to the present embodiment, the thermal conductors 42a and the thermal conductor 42b are serially connected to each other through the interconnection 32a extended horizontally to the substrate, which makes it easy to ensure region for the thermal conductors to be buried in. Accordingly to the present embodiment, the freedom of layout is higher.

The Method for Fabricating the Semiconductor Device

Next, the method for fabricating the semiconductor device according to the present embodiment will be explained with reference to FIGS. 9A to 12.

The steps up to the step of forming the inter-layer insulation film 30e including the inter-layer insulation film 30e forming step are the same as those of the method for fabricating the semiconductor device described above with reference to FIG. 4A, and their explanation will not be repeated.

Figure 9A:
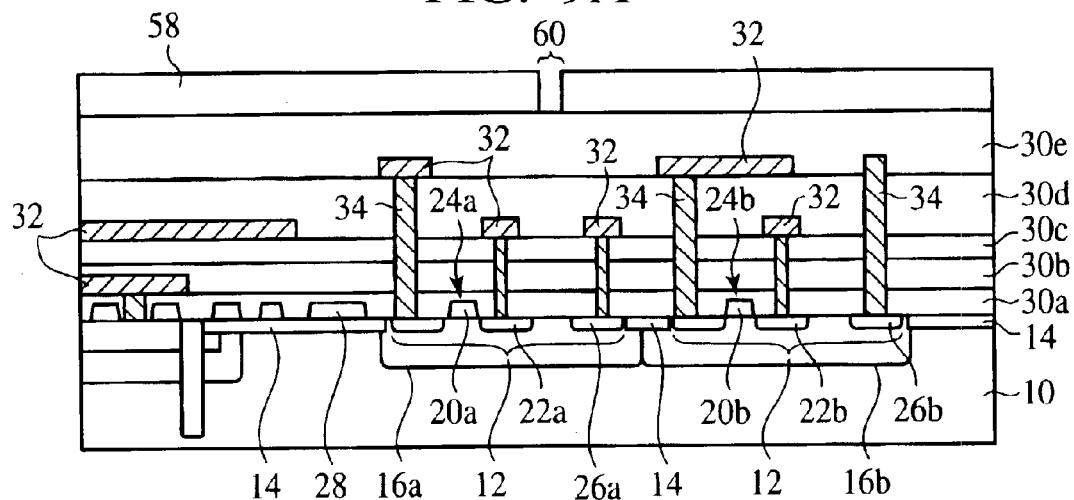
FIGS. 9A to 9C are sectional views of the semiconductor device according to the second embodiment of the present invention in the steps of the method for fabricating the semiconductor device, which explain the method (Part 1).

Next, as shown in FIG. 9A, a photoresist film 58 is formed on the entire surface by spin coating. Then, the photoresist film 58 is patterned by photolithography. Thus, the opening 60 is formed in the photoresist film down to the inter-layer insulation film 30e. The opening 60 is for forming in the inter-layer insulation films 30a–30e the opening 38c in which the thermal conductor 42a of a bundle of carbon nanotubes 40 is to be buried.

Then, the inter-layer insulation films 30a–30e are etched with the photoresist film 58 as a mask by, e.g., plasma etching. Thus, the opening 38c is formed down to, e.g., the surface of the semiconductor device 10. As an etching gas, $SF_6$, for example, is used as described above.

Figure 9B:
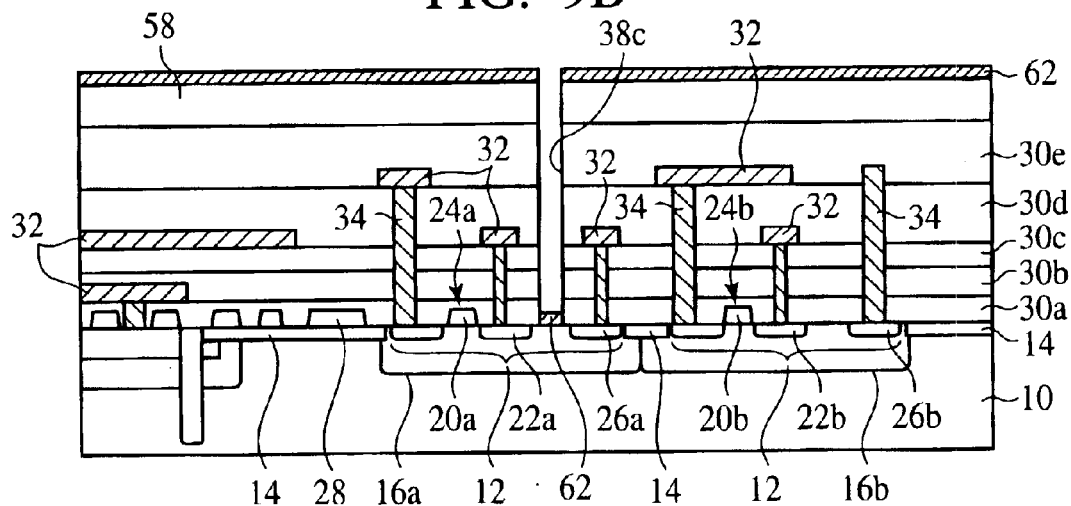

Next, as shown in FIG. 9B, a catalyst layer 62 is formed on the entire surface by, e.g., evaporation.

Then, the photoresist film 58 is lifted off to remove unnecessary part of the catalyst layer 62.

Figure 9C:
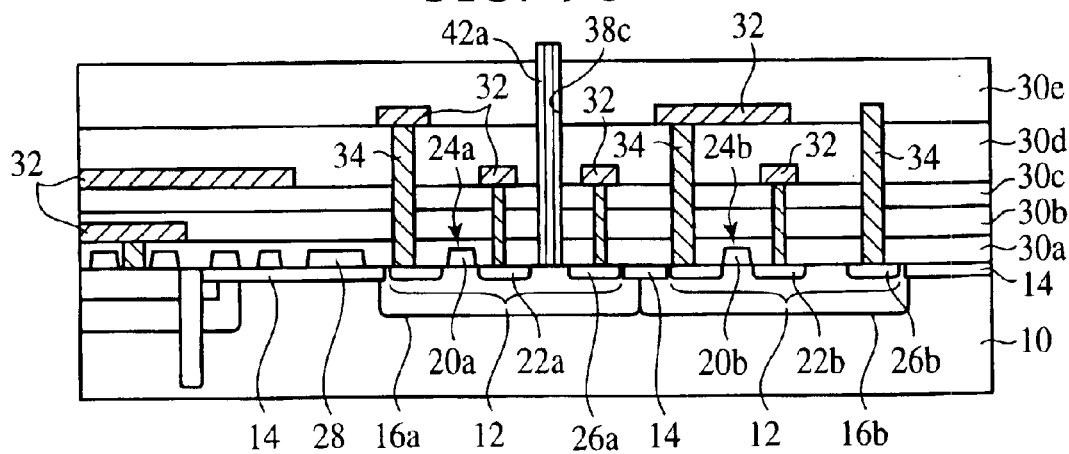

Next, as shown in FIG. 9C, the thermal conductor 42a of the carbon nanotubes 40 is grown in the opening 38c by, e.g., plasma CVD. Thus, the thermal conductor 42a of a bundle of the carbon nanotubes 40 is buried in the opening 38c. In FIG. 9C to FIG. 12, the catalyst layer 62 is omitted.

Figure 10A:
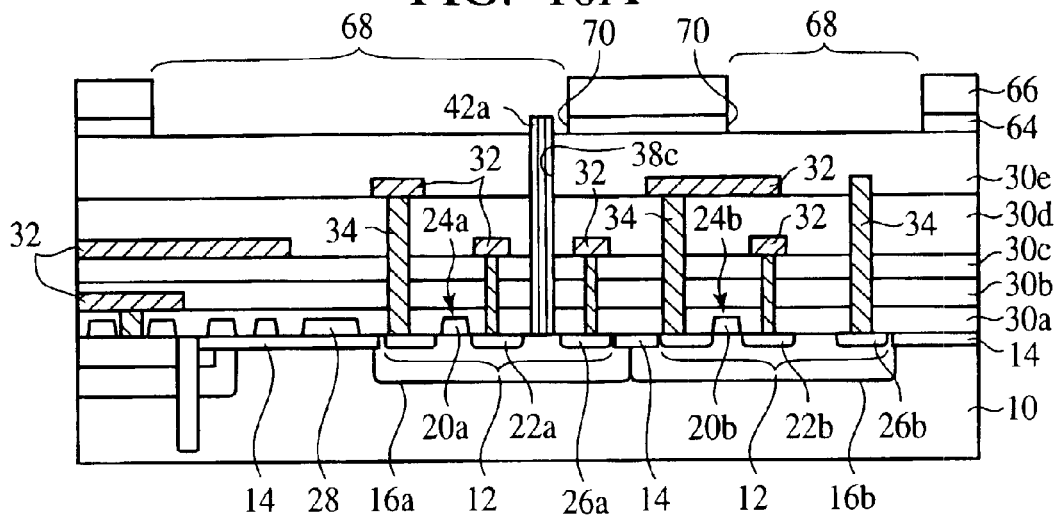
FIGS. 10A to 10C are sectional views of the semiconductor device according to the second embodiment of the present invention in the steps of the method for fabricating the semiconductor device, which explain the method (Part 2).

Then, as shown in FIG. 10A, the insulation film 64 of, e.g., a 500 nm-thickness $SiO_2$ is formed.

Next, a photoresist film 66 is formed on the entire surface by, e.g., spin coating. Then, the photoresist film 66 is patterned by photolithography. Thus the opening 68 is formed in the photoresist film 68.

Then, with the photoresist film 66 as a mask, the insulation film 64 is etched. Thus, grooves 70 for the interconnections 32, 32a to be buried in are formed in the insulation film 64.

Figure 10B:
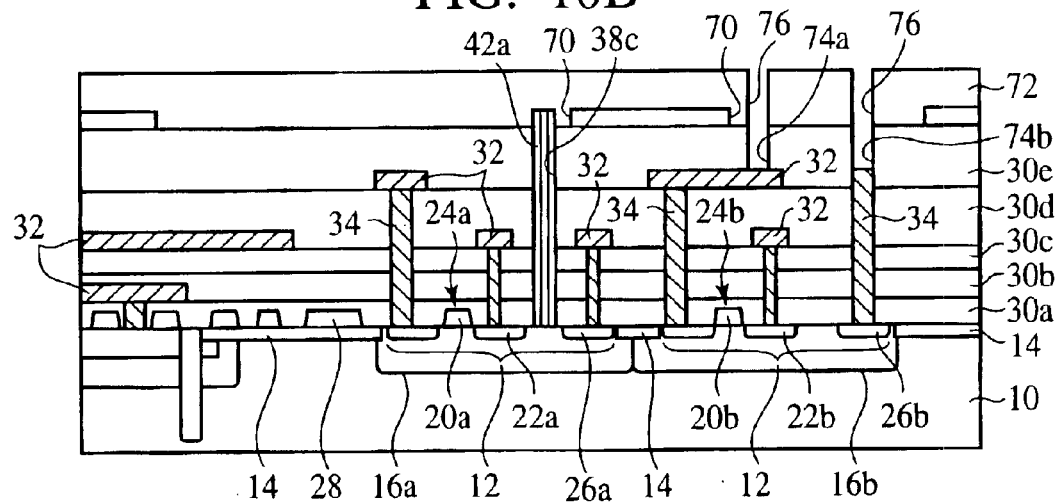

Next, as shown in FIG. 10B, a photoresist film 72 is formed on the entire surface by, e.g., spin coating. Next, the photoresist film 72 is patterned by photolithography. Thus, openings 76 for forming contact holes 74a, 74b in the inter-layer insulation film 30e are formed in the photoresist film 72.

Next, with the photoresist film 72 as a mask, the inter-layer insulation film 30e is etched. Thus, the contact hole 74a and the contact hole 74b are formed in the inter-layer insulation film respectively down to the interconnection 32 and the via 34.

Figure 10C:
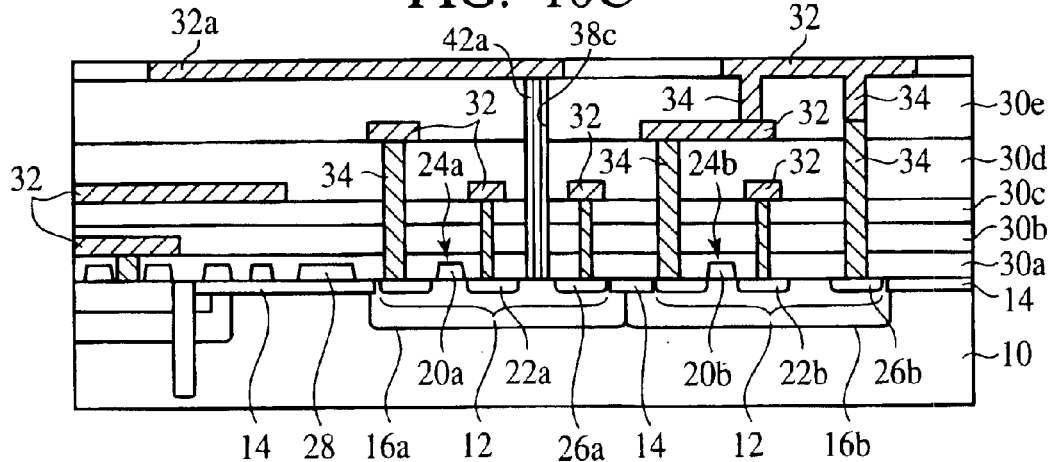

Then, as shown in FIG. 10C, the interconnections 32, 32a and the vias 34 are buried in the grooves 70 and the contact holes 74a, 74b by dual damascene. Specifically, first, a seed layer (hot shown) of, e.g. Ti is formed on the entire surface by, e.g., sputtering. Then, a Cu layer of, e.g., a 1 $\mu$m-thickness is formed by plating. Then, the Cu layer is polished by CMP (Chemical Mechanical-Polishing) until the surface of the insulation film 64 is exposed. Thus, the interconnections 32, 32a and the vias 34 are buried in the grooves 70 and the contact holes 74a, 74b.

Figure 11A:
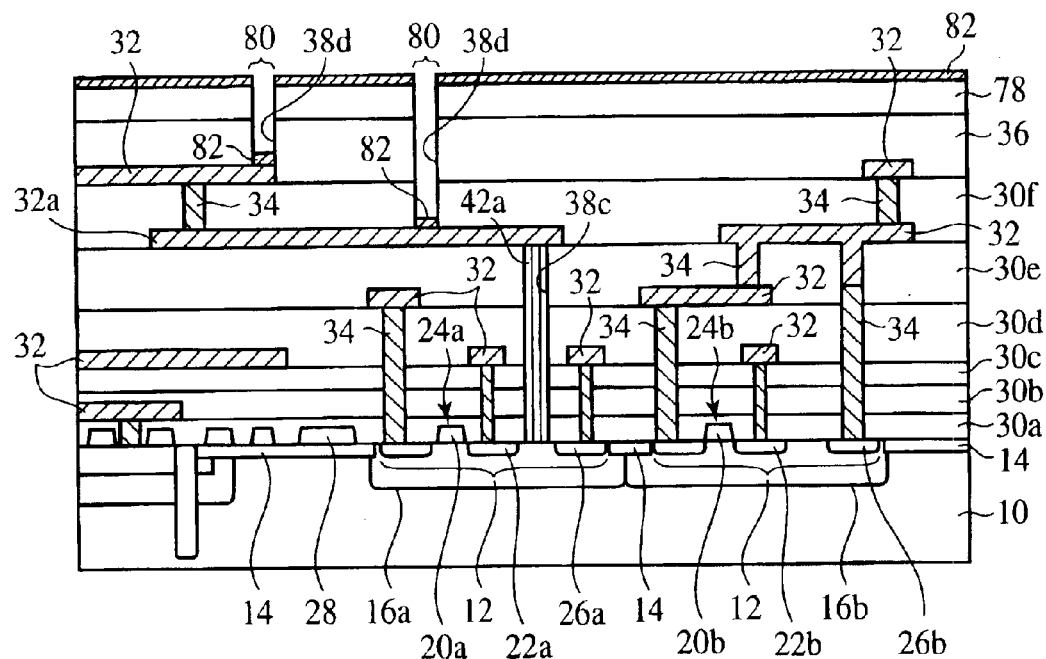
FIGS. 11A and 11B are sectional views of the semiconductor device according to the second embodiment of the present invention in the steps of the method for fabricating the semiconductor device, which explain the method (Part 3).

Then, as shown in FIG. 11A, the inter-layer insulation film 30f, the interconnection 32, the vias 34 and the protection film 36 are suitably formed.

Next, a photoresist film 78 is formed on the entire surface by spin coating. Next, the photoresist film 78 is patterned by photolithography. Thus, the opening 80 is formed in the photoresist film 78 down to the protection film 36. The opening 80 is for forming in the protection film 36 and the inter-layer insulation films 30e, 30f the opening 38d for the thermal conductor 42b of the carbon nanotubes 40 to be buried in.

Next, with the photoresist film 78 as a mask, the protection film 36 and the inter-layer insulation films 30e, 30f are etched by, e.g., plasma etching. Thus, the openings 38d is formed down to, e.g., the interconnection 32a. As an etching gas, SF$_6$, for example, can be used as described above.

Next, the catalyst layer 82 is formed on the entire surface by, e.g., evaporation. Thus, the catalyst layer 82 is formed on the bottom surface of the opening 38d.

Then, the photoresist film 78 is lifted off to remove the unnecessary part of the catalyst layer 82.

Figure 11B:
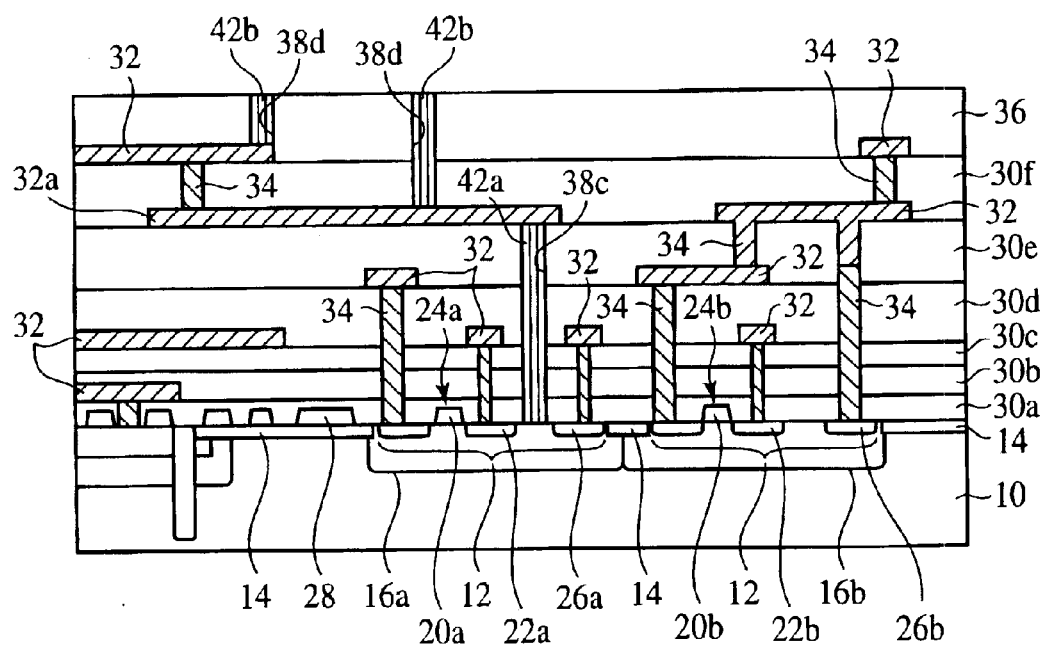
Figure 12:
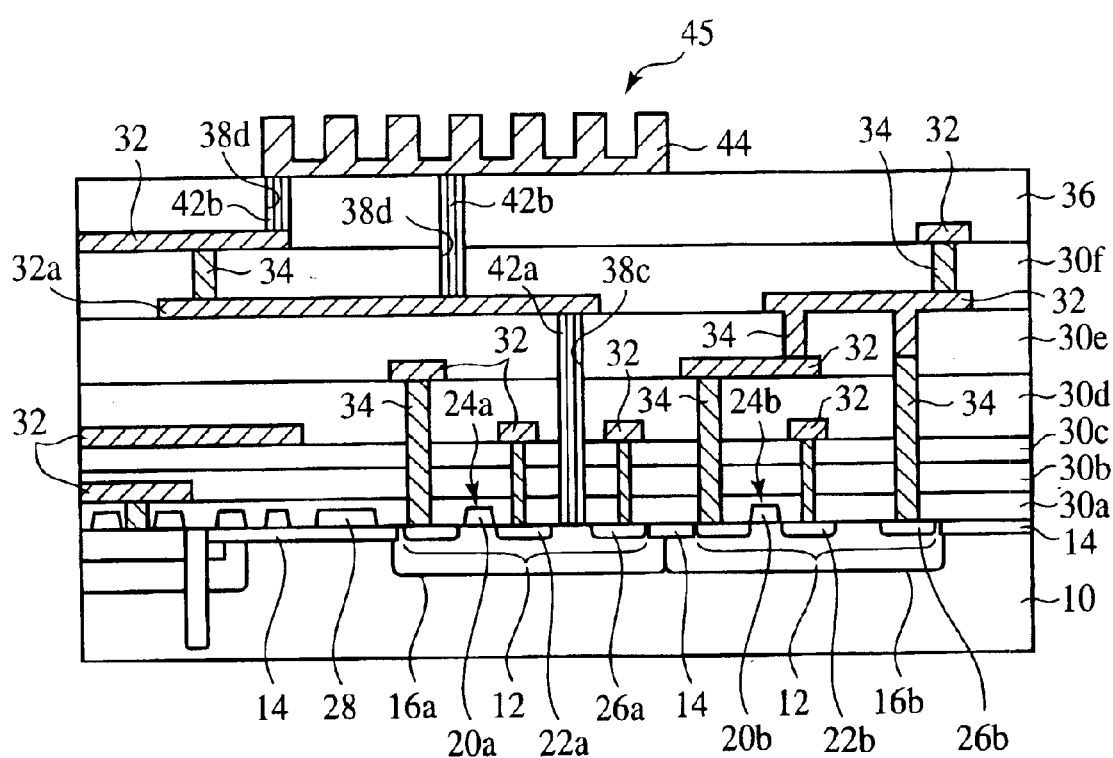
FIG. 12 is a sectional view of the semiconductor device according to the second embodiment of the present invention in the steps of the method for fabricating the semiconductor device, which explain the method (Part 4).

Then, as shown in FIG. 11B, the thermal conductor 42b of a bundle of the carbon nanotubes 40 is formed in the opening 38d by, e.g., plasma CVD. In FIGS. 11B to 12, the catalyst layer 82 is omitted.

Next, the thermal conductor 42b projected beyond the protection film 36 is removed by argon ion milling.

Then, in the same way as in the method for fabricating the semiconductor device described above with reference to FIGS. 6B and 7, the heat radiator plate 44 is formed (see FIG. 12).

Thus, the semiconductor device according to the present embodiment is fabricated.

Modification 1

Figure 13:
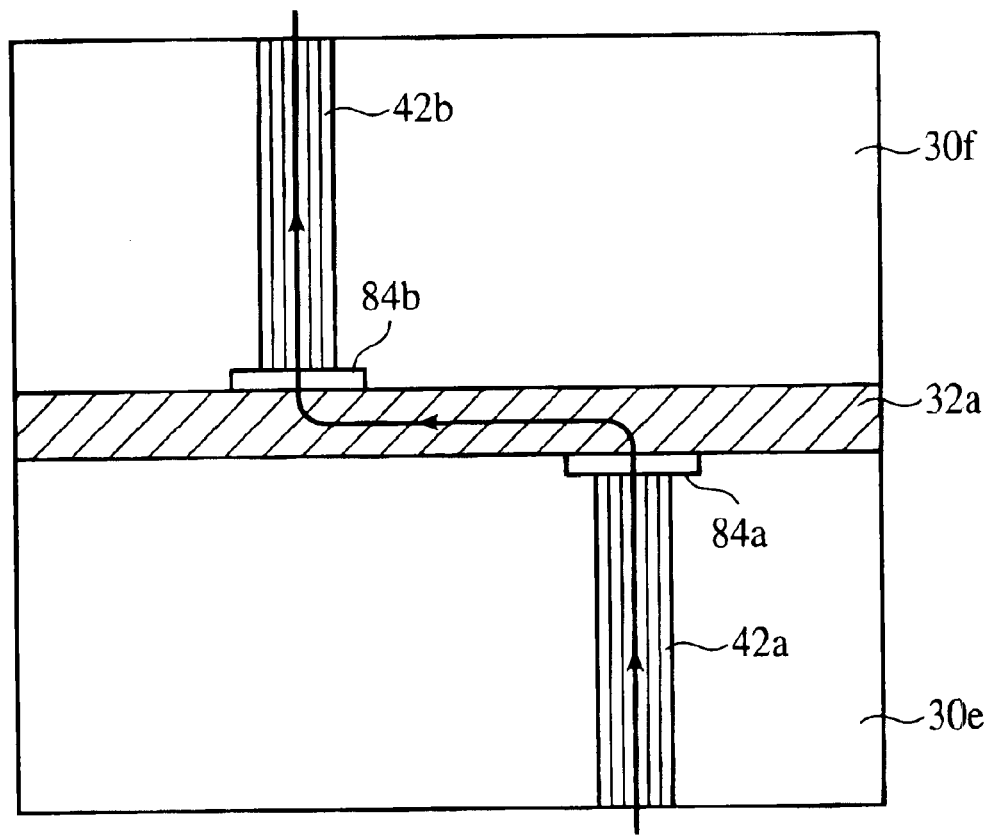
FIG. 13 is a sectional view of the semiconductor device according to Modification 1 of the second embodiment of the present invention.

Next, the semiconductor device according to Modification 1 of the present embodiment will be explained with reference to FIG. 13. FIG. 13 is a sectional view of the semiconductor device according to the present modification.

The semiconductor device according to the present modification is characterized mainly in that thin insulation films 84a, 84b are formed respectively between a thermal conductor 42a, 42b and an interconnection 32a which functions as an intermediate thermal conductor.

As shown in FIG. 13, the insulation film 84a of a 5 nm-film thickness which is formed of, e.g., SiO$_2$ is formed between the thermal conductor 42a and the interconnection 32a. The arrow in the drawing indicates the heat conduction path.

The insulation film 84b of a 5 nm-film thickness which is formed of, e.g., SiO$_2$ is formed between the interconnection 32a and the thermal conductor 42b.

As described above, according to the present modification, the insulation films 84a, 84b are formed respectively between the thermal conductors 42a, 42b and the interconnection 32a, whereby the thermal conductors 42a, 42b can be electrically insulated from the interconnection 32a. Furthermore, the insulation films 84a, 84b, which are thin, do not much hinder the thermal connection between the thermal conductors 42a and the interconnection 32a and the thermal connection between the interconnection 32a and the thermal conductor 42b. Thus, according to the present modification, the electric insulation between the thermal conductors 42a, 42b and the interconnection 32a is ensured while the thermal conductor 42a and the thermal conductor 42b can be thermally connected.

Modification 2

Figure 14:
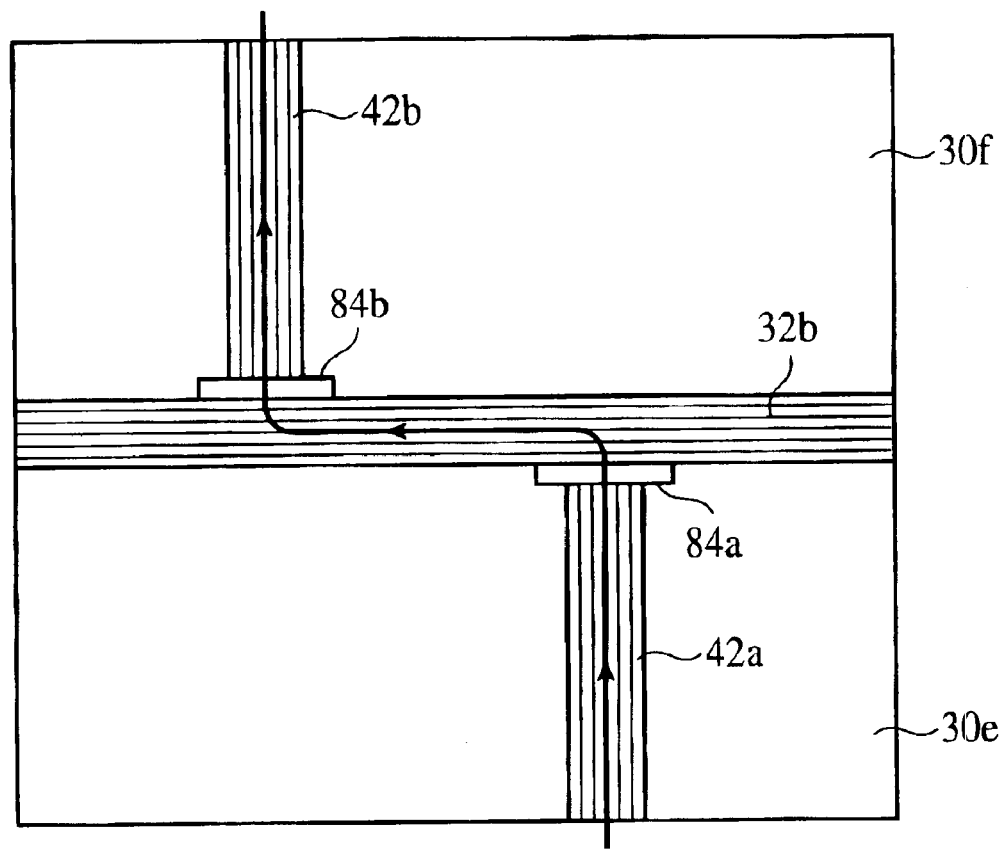
FIG. 14 is a sectional view of the semiconductor device according to Modification 2 of the second embodiment of the present invention.

Next, the semiconductor device according to Modification 2 of the present embodiment will be explained with reference to FIG. 14. FIG. 14 is a sectional view of the semiconductor device according to the present modification.

The semiconductor device according to the present modification is characterized mainly in that a thermal conductor 42a and a thermal conductor 42b are thermally connected by means of an interconnection 32a of a bundle of carbon nanotubes.

As shown in FIG. 14, an interconnection 32a of a bundle of carbon nanotubes is formed on an inter-layer insulation film 30e. The carbon nanotubes forming the interconnection 32a are grown horizontally to the substrate surface. To grow the carbon nonotubes horizontally to the substrate surface, carbon nanotubes are grown by, e.g., plasma CVD or thermal CVD while an electric field is being applied horizontally to the substrate surface.

The interconnection 32b of a bundle of carbon nanotubes is thermally connected to the thermal conductors 42a, 42b respectively through insulation films 84a, 84b.

In the semiconductor device shown in FIG. 8 or FIG. 13, the thermal conductor 42a and the thermal conductor 42b are thermally connected to each other through the interconnection of, e.g., Cu. Because of the thermal conductivity of Cu used as a material of the interconnection 32a, which is lower than that of the carbon nanotubes, good thermal conductivity cannot be always obtained.

However, in the present modification, carbon nanotubes, whose thermal conductivity is very high, are used as a material of the interconnection 32b, and even in the case that the thermal conductor 42a and the thermal conductor 42b are thermally connected to each other through the interconnection 32b, good thermal conductivity can be obtained.

Thus, the semiconductor device according to the present modification can have good heat radiation characteristics.

Modification 3

Figure 15:
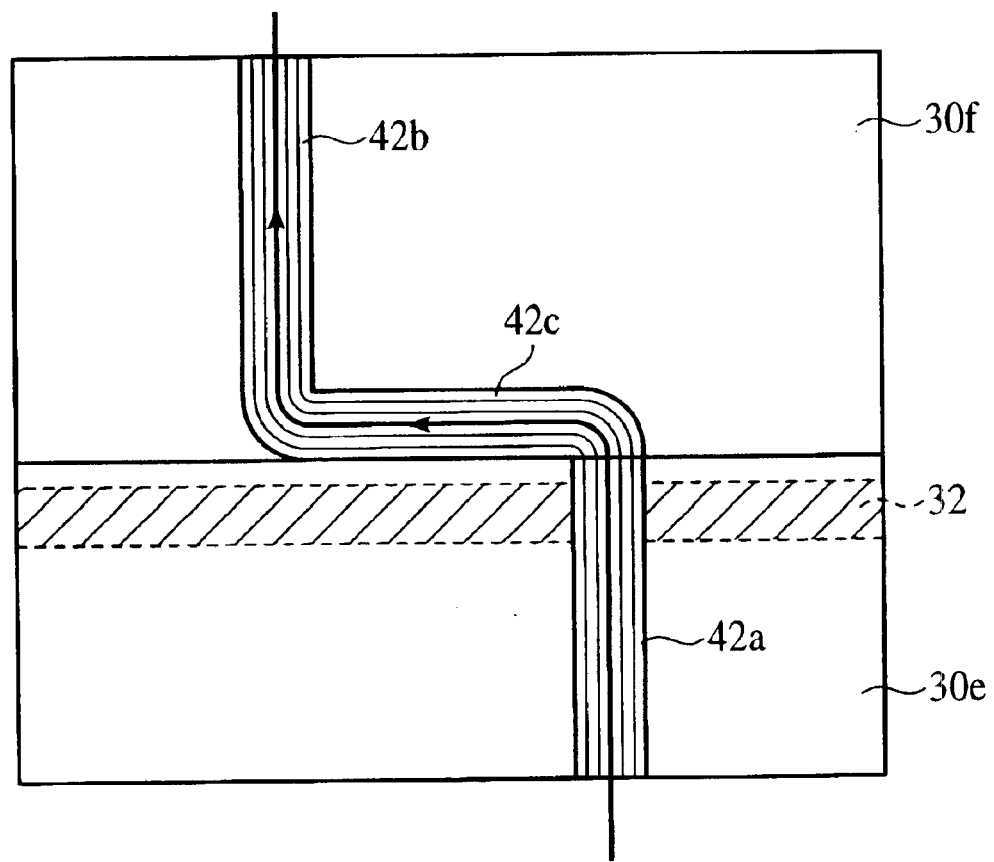
FIG. 15 is a sectional view of the semiconductor device according to Modification 3 of the second embodiment of the present invention.

Next, the semiconductor device according to Modification 3 of the present embodiment will be explained with reference to FIG. 15. FIG. 15 is a sectional view of the semiconductor device according to the present modification.

The semiconductor device according to the present modification is characterized mainly in that an intermediate thermal conductor 42c which thermally interconnecting a thermal conductor 42a and a thermal conductor 42b is formed integral with the thermal conductors 42a, 42b.

As shown in FIG. 15, the intermediate thermal conductor 42c of a bundle of carbon nanotubes is formed on an inter-layer insulation film 30e horizontally to the substrate. The intermediate thermal conductor 42c is formed integral with the thermal conductor 42a. The intermediate thermal conductor 42c is formed separate from an interconnection 32.

To grow carbon nanotubes horizontally to the substrate and integrally with the thermal conductor 42a, the carbon nanotubes are grown after the thermal conductor 42a has been formed, by, e.g., plasma CVD or thermal CVD while an electric field is being applied horizontally to the substrate surface. Carbon nanotubes are thus grown to thereby form the intermediate thermal conductor 42c integral with the thermal conductor 42a.

The thermal conductor 42b which has been grown perpendicularly to the substrate is formed at the end of the intermediate thermal conductor 42c. The thermal conductor 42b is formed integral with the intermediate thermal conductor 42c.

To form the thermal conductor 42b integral with the intermediate thermal conductor 42c, after the thermal conductor 42c has been grown, carbon nanotubes are grown by, e.g., plasma CVD or thermal CVD while an electric field is being applied perpendicularly to the substrate surface.

Thus, the thermal conductor 42a, the intermediate thermal conductor 42b and the thermal conductor 42c may be formed integral.

A Third Embodiment

Figure 16:
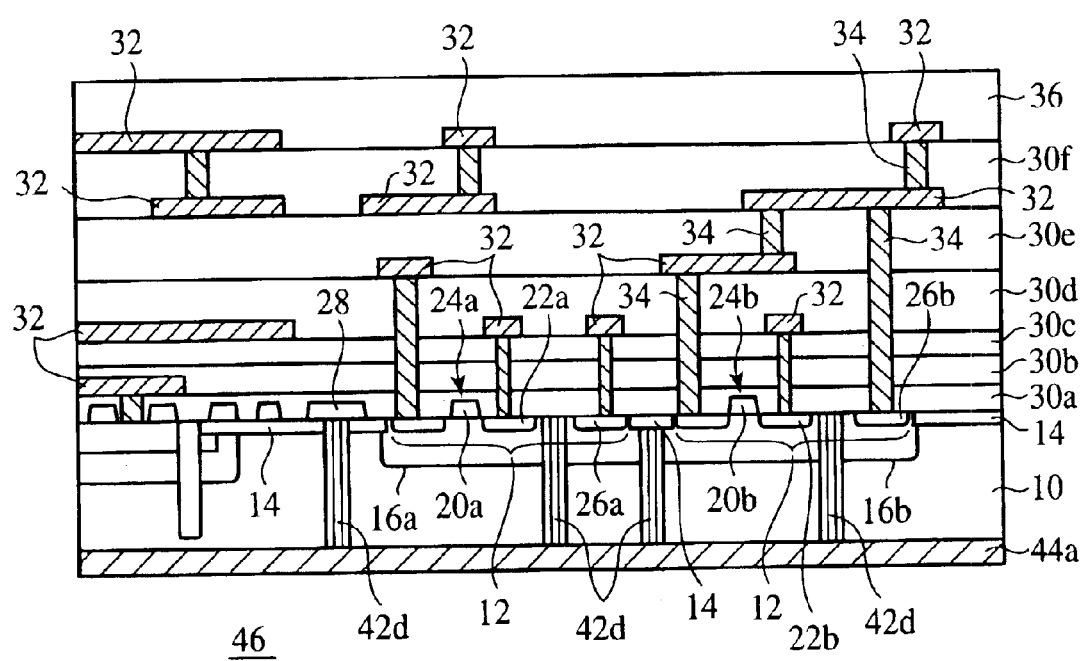
FIG. 16 is a sectional view of the semiconductor device according to a third embodiment of the present invention.

The semiconductor device according to a third embodiment of the present invention and the method for fabricating the semiconductor device will be explained with reference to FIG. 16 to FIG. 19. FIG. 16 is a sectional view of the semiconductor device according to the present embodiment.

FIGS. 17A to 19 are sectional views of the semiconductor device according to the present embodiment in the steps of the method for fabricating the semiconductor device, which explain the method. The same members of the present embodiment as those of the semiconductor device according to the first and the second embodiments and the method for fabricating the semiconductor device shown in FIGS. 1 to 15 are represented by the same reference numbers not to repeat or to simplify their explanation.

The Semiconductor Device

First, the semiconductor device according to the present embodiment will be explained with reference to FIG. 16.

The semiconductor device according to the present embodiment is characterized mainly in that thermal conductors 42d are buried in a semiconductor substrate 10, and heat can be radiated at the underside of the semiconductor substrate 10.

As shown in FIG. 16, the thermal conductors 42d of a bundle carbon nanotubes are buried in the semiconductor substrate 10.

A heat radiator plate 44a is formed on the underside of the semiconductor substrate 10 with the thermal conductors 42d buried in.

The heat radiator plate 44 contacts a heat bath 46 of air, water of others.

Thus, the semiconductor device according to the present embodiment is formed.

The present embodiment has very high freedom of burying the thermal conductors 42a because the thermal conductors 42d are buried in the semiconductor substrate 10. Accordingly, the present embodiment facilitates the layout in design.

The Method for Fabricating the Semiconductor Device

Next, the method for fabricating the semiconductor device according to the present embodiment will be explained with reference to FIGS. 17A to 19.

Figure 17A:
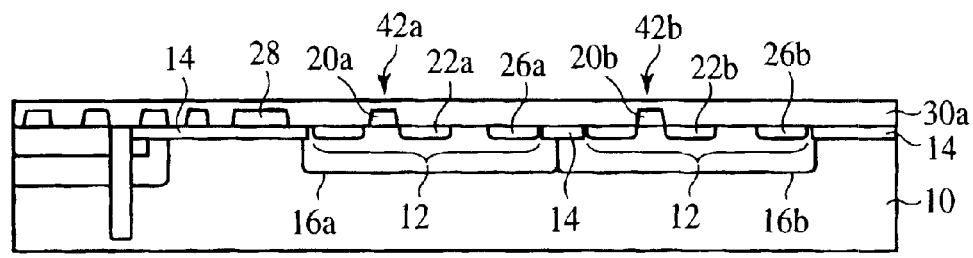
FIGS. 17A to 17D are sectional views of the semiconductor device according to the third embodiment of the present invention in the steps of the method for fabricating the same, which explain the method (Part 1).

First, as shown in FIG. 17A, transistors 24a, 24b, etc. are formed on the semiconductor substrate 10. Then, the inter-layer insulation film 30a is formed on the entire surface.

Figure 17B:
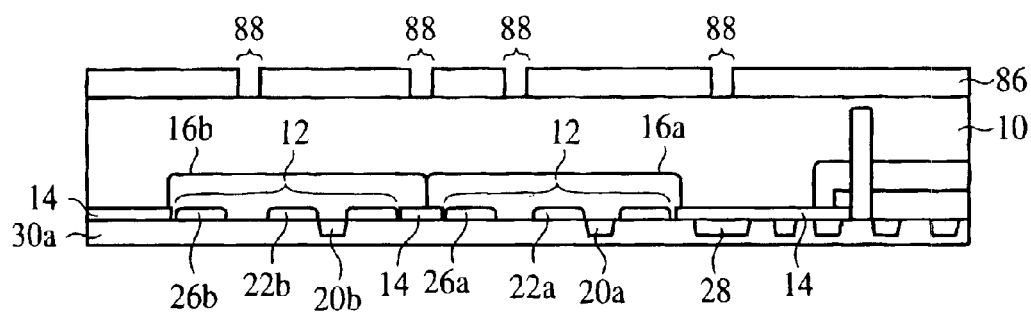

Then, as shown in FIG. 17B, the semiconductor substrate 10 is turned upside down.

Next, a photoresist film 86 is formed on the entire surface by spin coating. Then, the photoresist film 86 is patterned by photolithography. Thus, openings 88 are formed in the photoresist film 86 down to the semiconductor substrate 10. The openings 88 are for forming in the semiconductor substrate 10 openings 90 for carbon nanotubes 42d to be buried in.

Next, the semiconductor substrate 10 is etched by, e.g., plasma etching with the photoresist film 86 as a mask. Thus the opening 90a, 90b and the opening 90c, 90d are formed respectively down to the inter-layer insulation film 30a and the element isolation region 14.

Figure 17C:
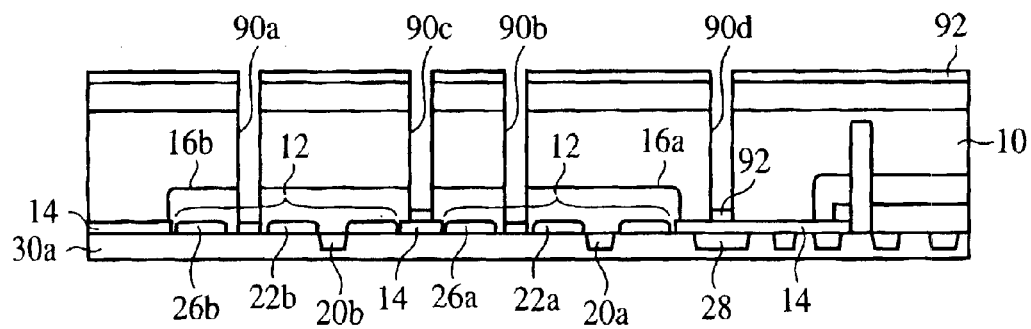

Next, as shown in FIG. 17C, a catalyst layer 92 is formed on the entire surface by, e.g., evaporation.

Then, the photoresist film 86 is lifted off to remove unnecessary part of the catalyst layer 92.

Figure 17D:
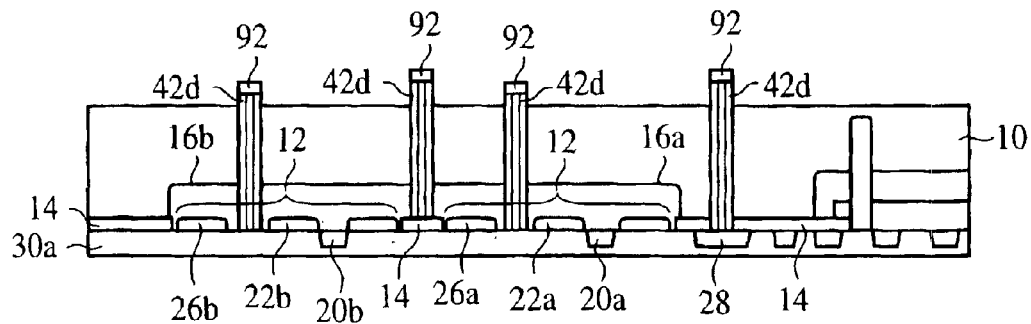

Next, as shown in FIG. 17D, the thermal conductors 42d of bundles of carbon nanotubes are formed in the openings 90a–90d by, e.g., plasma CVD. The carbon nanotubes are grown by plasma CVD, which leaves the catalyst layer 92 on the upper ends of the thermal conductors 42d.

Figure 18A:
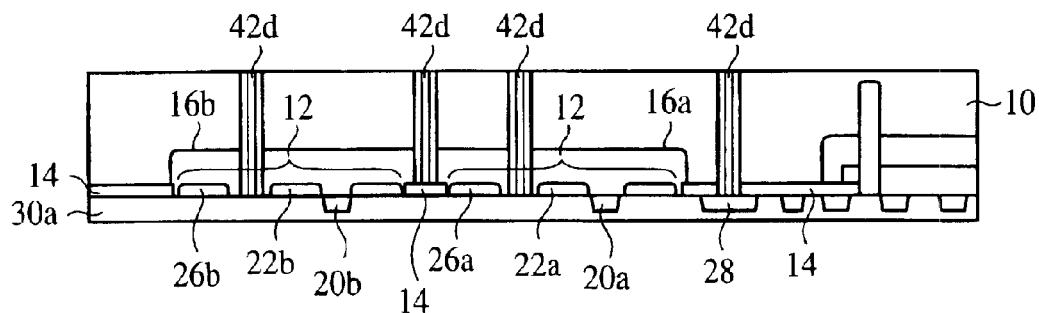
FIGS. 18A to 18C are sectional views of the semiconductor device according to the third embodiment of the present invention in the steps of the method for fabricating the same, which explain the method (Part 2).

Then, as shown in FIG. 18A, the thermal conductors 42d and the catalyst layer 92 which are projected beyond the semiconductor substrate 10 are removed by argon ion milling.

Figure 18B:
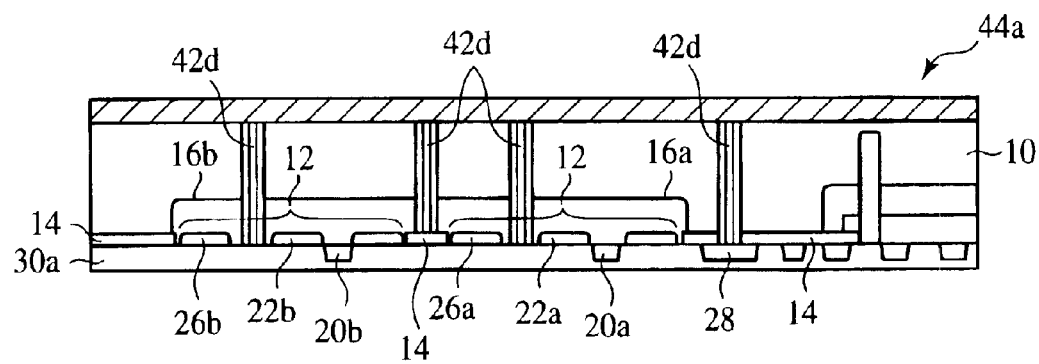
Figure 18C:
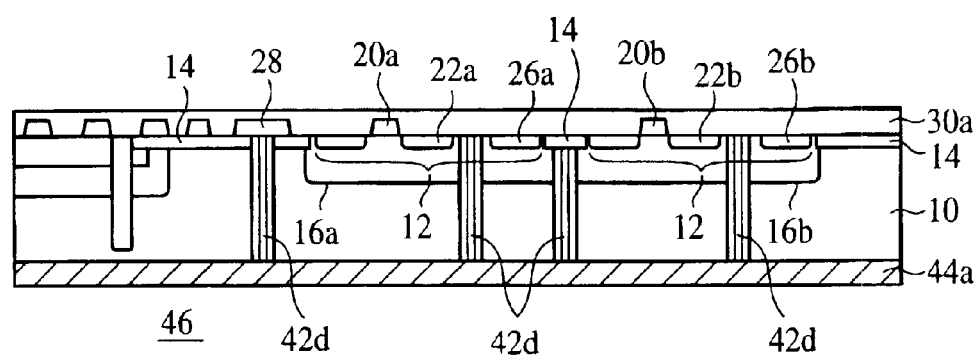

Then, as shown in FIG. 18B, a metal layer of 1 μm-thickness aluminum is formed on the entire surface by, e.g., vacuum evaporation. Thus, the heat radiator 44a is formed of the metal layer.

Then, the semiconductor substrate 10 is turned upside down.

Figure 19:
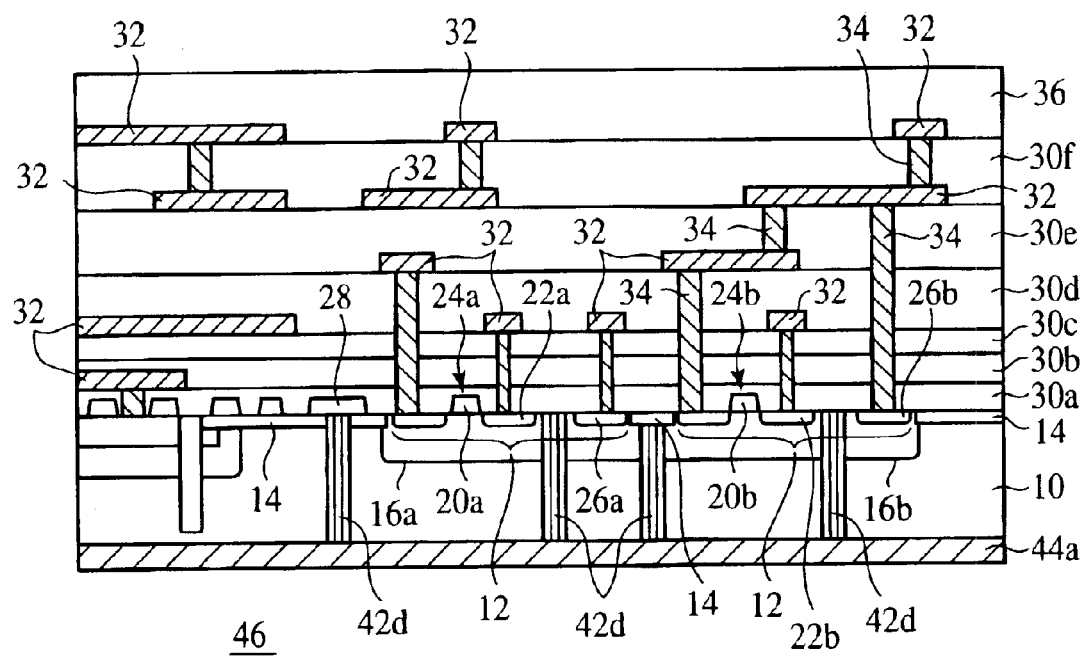
FIG. 19 is sectional views of the semiconductor device according to the third embodiment of the present invention in the steps of the method for fabricating the same, which explain the method (Part 3).

Next, in the same way as in the method for fabricating the semiconductor device described above with reference to FIG. 4A, inter-layer insulation films 30b–30f, an interconnection 32, vias 34, a protection film 36, etc. are suitably formed (see FIG. 19).

Thus, the semiconductor device according to the present embodiment is fabricated.

A Fourth Embodiment

Figure 20:
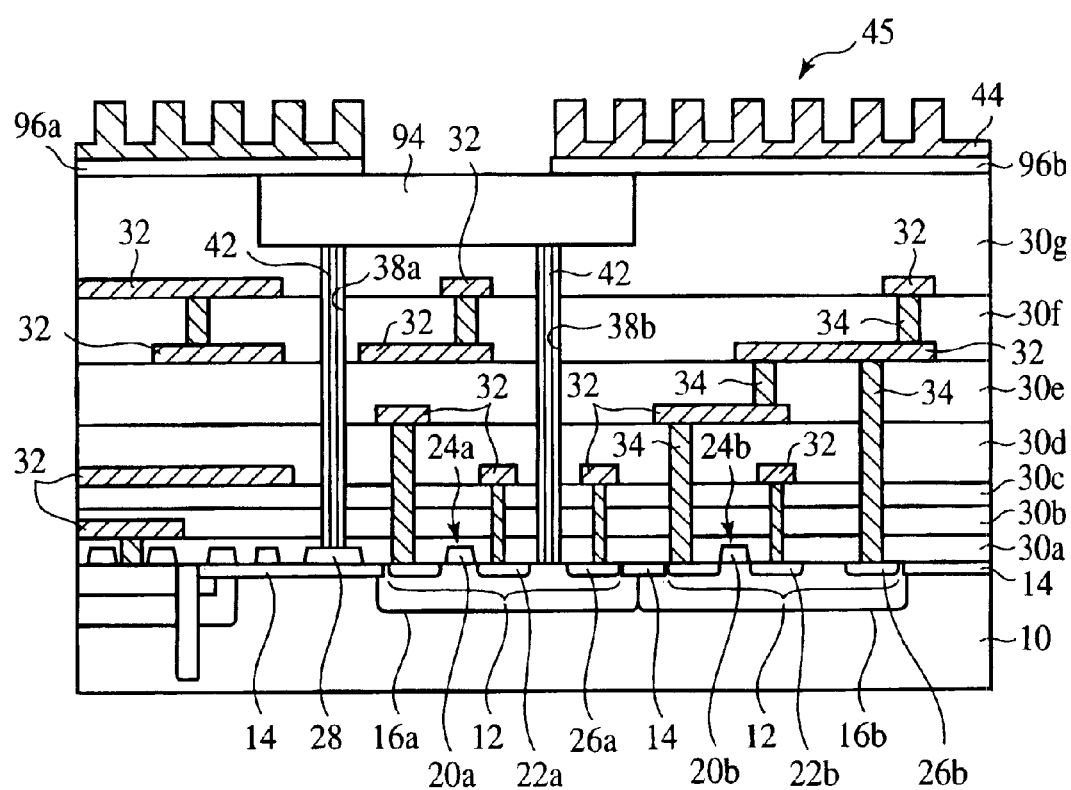
FIG. 20 is a sectional view of the semiconductor device according to a fourth embodiment of the present invention.

The semiconductor device according to a fourth embodiment of the present invention will be explained with reference to FIG. 20. FIG. 20 is a sectional view of the semiconductor device according to the present embodiment. The same members of the present embodiment as those of the semiconductor device according to the first to the third embodiments and the method for fabricating the semiconductor device shown in FIGS. 1 to 19 are represented by the same reference numbers not to repeat or to simplify their explanation.

The semiconductor device according to the present embodiment is characterized mainly in that thermal conductors 42 have the upper ends connected to a Peltier device 94 as a thermoelectric cooling element.

The Peltier device 94 comprises a p-semiconductor and an n-semiconductor arranged thermally in parallel and electrically serially and causes heat absorption (cooling) and heat radiation (heating) by Peltier effect.

As shown in FIG. 20, an inter-layer insulation film 30g is formed on the inter-layer insulation film 30f.

The Peltier device 94 is buried in the inter-layer insulation film 30g. The Peltier device 94 has the underside as the lower-temperature side and the upper side as the higher-temperature side.

The thermal conductors 42 have the upper sides connected to the underside of the Peltier device 94, i.e., the lower-temperature side.

Interconnections 96a, 96b are formed on the inter-layer insulation film 30g and the Peltier device 94. The interconnections 96a, 96b provide an electric power source for the Peltier device 94.

A heat radiator plate 44 is formed on the interconnections 96a, 96b. The heat radiator plate 44 is thermally connected to the upper side of the Peltier device 94, i.e., the higher-temperature side through the interconnections 96a, 96b.

Thus, the semiconductor device according to the present embodiment is formed.

According to the present embodiment, the Peltier device 94 as the thermoelectric cooling device is disposed between the heat radiator plate 44 and the thermal conductors 42, whereby the thermal conductors 42 can be further cooled. Accordingly, in the present embodiment, the semiconductor elements, such as the transistors 24a, 24b, etc., can be further cooled.

Modifications

The present invention is not limited to the above-described embodiments and can cover other various modifications.

For example, in the above-described embodiments, the heat radiator plate is provided but is not essential. For example, the thermal conductors may contact directly the heat bath. However, the provision of the heat radiator plate makes the heat radiation more effective.

In the above-described embodiments, the thermal conductors are formed of bundles of carbon nanotubes, but bundles of nanotubes are not essential. The thermal conductor may be formed of one carbon nanotube.

In the third embodiment, no cavities and convexities are formed in the surface of the heat radiator plate 44a. However, concavities and convexities may be formed in the surface of the heat radiator plate 44a, which can improve the heat radiation characteristics.

What is claimed is:

1. A semiconductor device comprising:
   an insulation film formed over a semiconductor substrate;
   a thermal conductor buried in the insulation film; and
   a heat radiator plate thermally connected to the thermal conductor,
   the thermal conductor being formed of a tube structure of carbon atoms.

2. A semiconductor device according to claim 1, further comprising:
   another thermal conductor thermally connected to said thermal conductor,
   said another thermal conductor being formed of a tube structure of carbon atoms.

3. A semiconductor device comprising:
   an insulation film formed over a semiconductor substrate;
   a thermal conductor buried in the insulation film;
   another thermal conductor thermally connected to said thermal conductor; and
   an intermediate thermal conductor which thermally interconnects said thermal conductor and said another thermal conductor,
   the thermal conductor being formed of a tube structure of carbon atoms,
   said another thermal conductor being formed of a tube structure of carbon atoms.

4. A semiconductor device according to claim 3, further comprising:
   an insulation film formed at least between said thermal conductor and said intermediate thermal conductor or between said another thermal conductor and said intermediate thermal conductor.

5. A semiconductor device according to claim 3, wherein the intermediate thermal conductor functions also as an electric interconnection.

6. A semi conductor device according to claim 4, wherein the intermediate thermal conductor functions also as an electric interconnection.

7. A semiconductor device according to claim 3, wherein the intermediate thermal conductor is formed integral with at least said thermal conductor or said another thermal conductor.

8. A semiconductor device according to claim 3, wherein the intermediate thermal conductor is formed of a tube structure of carbon atoms.

9. A semiconductor device according to claim 4, wherein the intermediate thermal conductor is formed of a tube structure of carbon atoms.

10. A semiconductor device according to claim 5, wherein the intermediate thermal conductor is formed of a tube structure of carbon atoms.

11. A semiconductor device according to claim 6, wherein the intermediate thermal conductor is formed of a tube structure of carbon atoms.

12. A semiconductor device according to claim 7, wherein the intermediate thermal conductor is formed of a tube structure of carbon atoms.

13. A semiconductor device comprising:
    a thermal conductor buried in a semiconductor substrate; and
    a heat radiator plate thermally connected to the thermal conductor,
    the thermal conductor being formed of a tube structure of carbon atoms.

14. A semiconductor device according to claim 1, wherein the heat radiator plate is formed of a metal.

15. A semiconductor device according to claim 1, further comprising:
    a thermoelectric cooling element connected to the thermal conductor.

16. A semiconductor device according to claim 2, further comprising:
    a thermoelectric cooling element connected to the thermal conductor.

17. A semiconductor device according to claim 3, further comprising:
    a thermoelectric cooling element connected to the thermal conductor.

18. A method for fabricating a semiconductor device comprising the steps of:
    forming an insulation film over a semiconductor substrate;
    forming an opening in the insulation film;
    growing a thermal conductor of a tube structure of carbon atoms in the opening; and
    forming a heat radiator plate thermally connected to the thermal conductor.

19. A method for fabricating a semiconductor device comprising the steps of:
    forming an opening in a semiconductor substrate; and
    growing a thermal conductor of a tube structure of carbon atoms in the opening.

20. A semiconductor device according to claim 13, wherein
    the heat radiator plate is formed of a metal.

21. A semiconductor device comprising:
    an insulation film formed over a semiconductor substrate; and
    a thermal conductor buried in the insulation film,
    the thermal conductor being formed of a tube structure of carbon atoms,
    wherein the thermal conductor is extended in a direction from the semiconductor substrate to a heat bath, and the thermal conductor is connected directly to the heat bath.

22. A semiconductor device comprising:
    a thermal conductor buried in a semiconductor substrate,
    the thermal conductor being formed of a tube structure of carbon atoms,
    wherein the thermal conductor is connected directly to a heat bath.

23. A method for fabricating a semiconductor device according to claim 19, further comprising, after the step of growing the thermal conductor:
    a step of forming a heat radiator plate thermally connected to the thermal conductor.

24. A method for fabricating a semiconductor device comprising a thermal conductor connected directly to a heat bath, the method comprising the steps of:
    forming an insulation film over a semiconductor substrate;
    forming an opening in the insulation film; and
    growing a thermal conductor of a tube structure of carbon atoms in the opening.

* * * * *